US006041434A

United States Patent [19]

Kamishima

[11] Patent Number: 6,041,434

[45] Date of Patent: Mar. 21, 2000

[54] CODE GENERATOR FOR SELECTIVELY PRODUCING CYCLIC REDUNDANCY CHECK DATA CODES DIFFERENT IN DATA LENGTH

[75] Inventor: Yoshiyuki Kamishima, Tokyo, Japan

[73] Assignee: NEC Corporation, Tokyo, Japan

[21] Appl. No.: 08/941,320

[22] Filed: Sep. 30, 1997

[30] Foreign Application Priority Data

Oct. 9, 1996 [JP] Japan .................................... 8-268046

[51] Int. Cl.[7] .................................................... H03M 13/00

[52] U.S. Cl. ............................................ 714/807; 714/781

[58] Field of Search .................................... 714/752, 758, 714/776, 781, 782, 774, 807

[56] References Cited

U.S. PATENT DOCUMENTS 4,734,921 3/1988 Giangano et al. ........................ 377/72
4,870,346 9/1989 Mydill et al. ......................... 324/73 R
5,051,999 9/1991 Erhart et al. .............................. 371/41
5,781,566 7/1998 Bennett et al. ...................... 371/37.07

FOREIGN PATENT DOCUMENTS 61-237521 10/1986 Japan .
6-37737 2/1994 Japan .

*Primary Examiner*—Stephen M. Baker
*Attorney, Agent, or Firm*—Young & Thompson

[57] ABSTRACT

A code generator incorporated in a transmitter has data paths different in length for producing cyclic redundancy check codes different in data length from digital data signals being supplied, and circuit components of the data path shortest of all are shared with other data paths so that the code generator is fabricated from a small number or circuit components.

13 Claims, 9 Drawing Sheets

CODE GENERATOR FOR SELECTIVELY PRODUCING CYCLIC REDUNDANCY CHECK DATA CODES DIFFERENT IN DATA LENGTH

FIELD OF THE INVENTION

This invention relates to a code generator for a cyclic redundancy check code and, more particularly, to a code generator for providing cyclic redundancy check codes different in data length to a transmission data frame.

DESCRIPTION OF THE RELATED ART

The cyclic redundancy check code is incorporated in a transmission data frame to see whether or not an bit error takes place in the transmission data code. FIGS. 1A and 1B illustrate two kinds of transmission data frame formats. The first kind of format is illustrated in FIG. 1A, and the transmission data frame 1/2 has a transmission data field 1*a*/2*a* assigned to a transmission data code and a cyclic redundancy check data field 1*b*/2*b* assigned to a cyclic redundancy check code CRC. Although the transmission data frames 1/2 have different data length, they are coded into the same format. The transmission data field 1*a* is short, and is accompanied with an 8-bit cyclic redundancy check code CRC. On the other hand, the transmission data field 2*a* is long, and a 32-bit redundancy check code CRC is required. In the following description, the cyclic redundancy check code CRC is suffixed with the number of component bits. The 32-bit cyclic redundancy check code and the 8-bit cyclic redundancy check code are, by way of example, represented by "CRC32" and "CRC8", respectively.

The transmission data code is supplied to a code generator (see FIGS. 2 and 3) incorporated in a transmitter, and the code generator produces the cyclic redundancy check code CRC8/CRC32 on the basis of the transmission data code. The cyclic redundancy check code CRC8/CRC32 is added to the transmission data code, and the transmission data code and the cyclic redundancy check code CRC8/CRC32 form in combination the transmission data frame 1/2. The transmitter sends the transmission data frame to a receiver (not shown).

A collator is incorporated in the receiver, and the transmission data frame 1/2 is supplied to the collator. The collator carries out a predetermined calculation to see whether or not the predetermined calculation results in expected value. If the calculation result is matched with the expected value, the collator decides the transmission data code does not contain any error. On the other hand, if the calculation result is inconsistent with the expected value, the collator decides that an error has been introduced into the transmission data code.

A transmission data frame 3 is formatted differently as shown in FIG. 1B. The transmission data frame 3 is used in a radio local area network defined in IEEE802.11. The transmission data frame 3 has a header field 3*a* assigned to a header and a data field 3*b* assigned to a transmission data code, and two cyclic redundancy check data fields 3*c* and 3*d* are added to the header field 3*a* and the data field 3*b*, respectively. The header is shorter than the transmission data code, and the cyclic redundancy check codes CRC16 and CRC32 are different in data length from each other. In this instance, the cyclic redundancy check code CRC16 consists of sixteen bits, and the cyclic redundancy check code CRC32 has thirty-two bits. The collator treats the transmission data frame 3 similarly to the above described transmission data frames 1/2.

FIG. 2 illustrates the prior art code generator 10 available for the 8-bit cyclic redundancy check code. Eight flip flop circuits 11*a*, 11*b*, 11*c*, 11*d*, 11*e*, 11*f*, 11*g* and 11*h*, three exclusive-OR gates 12*a*, 12*b* and 12*c* and an inverter 13 form in combination the prior art code generator 10. The flip flop circuits 11*a* to 11*h* are connected in cascade, and the exclusive-OR gates 12*a*/12*b*/12*c* are associated with the flip flop circuits 11*a*/11*e*/11*h*. The output nodes Q of the flip flop circuits 11*a*/11*e* are respectively connected to the input nodes of the exclusive-OR gates 12*a*/12*b*, and the output nodes of the exclusive-OR gates 12*a*/12*b* are connected to the input nodes D of the next flip flop circuits 11*b*/11*f*. The output node Q of the last flip flop circuit 11*h* is connected to an input node of the exclusive-OR gate 12*c*, and the output node of the exclusive-OR gate 12*c* is connected to the input node D of the first flip flop circuit 11*a*. Thus, the flip flop circuits 11*a* to 11*h* and the exclusive-OR gates 12*a* to 12*c* form a data path, and the output node Q of the last flip flop circuit 11*h* is connected through the inverter 13 to a data output terminal 14.

The prior art code generator 10 has a reset terminal 15 connected to the reset nodes of the flip flop circuits 11*a* to 11*h*, a clock node 16 connected to the clock nodes of the flip flop circuits 11*a* to 11*h* and a data input node 17 connected to the other input node of the exclusive-OR gate 12*c*. The output node of the exclusive-OR gate 12*c* is further connected to the input nodes of the other exclusive-OR gates 12*a*/12*b*.

The flip flop circuits 11*a*, 11*e* and 11*h* are corresponding to terms $X_8$, $X_5$ and X, respectively, and the 8-bit cyclic redundancy check code CRC8[$G_8(X)$] is given as follows.

$$G_8(X)=X^8+X^5+X+1 \quad \text{Equation 1}$$

On the other hand, the 16-bit cyclic redundancy check code is produced by a prior art code generator shown in FIG. 3. Eight flip flop circuits 11*i* to 11*p* are added to the data path, and the exclusive-OR gates 12*a*/12*b*/12*c* are associated with the flip flop circuits 11*e*/11*l*/11*p*, and the flip flop circuits 11*e*/11*l*/11*p* are corresponding to $X^{16}$, $X^{12}$ and $X^5$, respectively. The 16-bit cyclic redundancy check code CRC16[$G_{16}(X)$] is given by equation 2.

$$G_{16}(X)=X^{16}+X^{12}+X^5+1 \quad \text{Equation 2}$$

Though not shown in the drawings, the 32-bit cyclic redundancy check code CRC32 is produced by a code generator. The code generator executes the calculation expressed by equation 3.

$$G_{32}(X)=X^{32}+X^{26}+X^{23}+X^{22}+X^{16}+X^{12}+X^{11}+X^{10}+X^8+X^7+X^5+X^4+X^2+X+1 \quad \text{Equation 3}$$

As described hereinbefore, the transmission data frame defined in IEEE802.11 has the cyclic redundancy check codes CRC16 and CRC32 different in data length, and the transmitter requires the code generators for the redundancy check codes CRC16 and CRC32. In the prior art transmitter, the code generators are connected in parallel to a multiplexer, and the header and the transmission data code are selectively supplied to the code generators.

FIGS. 4A and 4B illustrate the prior art transmitter. The prior art transmitter shown in FIG. 4A includes a first-in-first-out register FIFO, a parallel-to-serial converter 20 connected to the first-in-first-out register FIFO, the code generators 21/22 connected in parallel to the parallel-to-serial converter 20 and a multiplexer 23 connected in parallel to the parallel-to-serial converter 20 and the code generators 21/22. The data codes to be transmitted are firstly written into the first-in-first-out register FIFO, and enter into the waiting queue. The data codes are successively read out from the first-in-first-out register FIFO, and each data code is supplied to the parallel-to-serial converter 20. The parallel-to-serial converter 20 converts the data code to a serial data signal, and the serial data signal is supplied to the code generators 21/22 and the multiplexer 23. The multiplexer 23 transfers the serial data signal to an output terminal 24, and the serial data signal is stored in the header field 3*a* or the data field 3*b*. The code generators 21/22 produce the cyclic redundancy check codes CRC16/CRC32, and the multiplexer 23 selectively connects the code generators 21/22 to the output terminal 24 so as to store the cyclic redundancy check code CRC16/CRC32 to the appropriate cyclic redundancy check data field 3*c* or 3*d*.

If the prior art transmitter is used for the transmission data frames 1 and 2, the code generators 21/22 produces the cyclic redundancy check codes CRC8/CRC32 from the transmission data code 1*a* or 2*a*, and the multiplexer 23 selects one of the cyclic redundancy check codes CRC8 and CRC32. One of the code generators 21 and 22 may be activated depending upon the data length of the code.

The prior art transmitter shown in FIG. 4B also includes the first-in-first-out register FIFO, the parallel-to-serial converter 20, code generators 25/26 and a multiplexer 27. The code generators 25/26 produces the cyclic redundancy check codes CRC16/CRC32 from the serial data signal, and supply the cyclic redundancy check codes CRC16/CRC32 to the multiplexer 27 as a parallel data. The multiplexer 27 not only transfers the data code to the parallel-to-serial converter 20 but also selects one of the cyclic redundancy check codes CRC16/CRC32. The code generators 25/26 may be selectively activated after the transmission of the header and the transmission of the transmission data code.

In detail, each data code is supplied to the first-in-first-out register FIFO, and enters into a waiting cue. The first-in-first-out register FIFO successively supplies the data codes to the multiplexer 23. The multiplexer 23 transfers the data code to the parallel-to-serial converter 20, and the data code is converted to a serial data signal. The serial data signal is transferred to the output terminal 24 and the code generators 25/26. The serial data signal is delivered from the output terminal 24 as the header field or the data field. The code generators 25/26 produces the cyclic redundancy check codes CRC16/CRC32 from the serial data signal, and supply the cyclic redundancy check codes to the multiplexer 23 as the parallel data. The multiplexer 23 selects one of the cyclic redundancy check codes depending upon the kind of the data code, and transfers the cyclic redundancy check code CRC16 or CRC32 to the parallel-to-serial converter 20. The selected cyclic redundancy check code CRC16 or CRC32 is delivered from the output terminal 24 as either cyclic redundancy check data field 3*c* or 3*d*.

FIG. 5 illustrates the data transmission through the prior art transmitter shown in FIG. 4A. The prior art transmitter is assumed to deliver the transmission data frame 3 to a receiver, and the code generators 21 and 22 produce the cyclic redundancy check code CRC16 and the cyclic redundancy check code CRC32 from the header and the transmission data code, respectively.

The reset signal for the code generator 21 is changed to the low level at time t1, and the parallel-to-serial converter 20 supplies the serial data signal representative of the header to the code generators 21/22 and the multiplexer 23 in synchronism with the clock signal. The code generator 21 starts the execution of the calculation expressed by equation 2 so as to produce the cyclic redundancy check code CRC16. However, the other code generator 22 still stands idle.

A controller (not shown) changes the control signal SEL1 to active level at time t2, and the control signal SEL1 is supplied to the multiplexer 23. The multiplexer 23 is responsive to the control signal SEL1 so as to transfer the serial data signal representative of the header to the output terminal 24. The header is supplied to the receiver as the header field 3*a*.

The controller recovers the control signal SEL1 to inactive level at time t3, and changes the control signal SEL2 to the active level. The control signal SEL2 causes the multiplexer 23 to transfer the cyclic redundancy check code CRC16 from the code generator 21 to the output terminal 24. Then, the cyclic redundancy check code CRC16 is delivered to the receiver as the cyclic redundancy check data field 3*c*.

The reset signal for the code generator 22 is changed to the low level at time t4, and the code generator 22 becomes active. The parallel-to-serial converter 20 supplies the serial data signal representative of the transmission data code to the code generators 21/22 and the multiplexer 23. The code generator 22 starts the execution of the calculation expressed by equation 3 so as to produce the cyclic redundancy check code CRC32 from the serial data signal representative of the transmission data code. However, the reset signal for the code generator 21 is recovered to the high level at time t5, and the code generator 21 stops the calculation expressed by equation 2.

The controller changes the control signal SEL2 and the control signal SEL1 to the inactive level and the active level at time t5, respectively. The control signal SEL1 makes the multiplexer 23 transfer the serial data signal representative of the transmission data code to the output terminal 24, and the serial data signal representative of the transmission data code is delivered to the receiver as the data field 3*b*.

The controller changes the control signal SEL1 and the control signal SEL3 to the inactive level and the active level, respectively at time t6. Then, the multiplexer 23 provides a data path from the code generator 22 to the output terminal 24, and the cyclic redundancy check code CRC32 is delivered to the receiver as the cyclic redundancy check data field 3*d*.

The reset signal for the code generator 22 is recovered to the high level at time t7, and the controller changes the control signal SEL3 to the inactive level. Then, the prior art transmitter returns to the initial condition.

Thus, the prior art transmitter selectively distributes data codes different in data length to the code generators, and alternately delivers the cyclic redundancy check codes and the associated data codes. However, a problem is encountered in the prior art transmitter in a large number of the code generator as many as the cyclic redundancy check codes to be required. If the prior art transmitter is expected to produce two cyclic redundancy check data codes CRC8 and CRC16, eight flip flop circuits and three exclusive-OR gates are required for one of the code generators, and sixteen flip flop circuits and three exclusive-OR gates are required for the other of the code generators. As a results, the total number of flip flop circuits and the total number of the exclusive-OR gates are twenty-four and six, respectively. Thus, even if the prior art transmitter is expected to produce only two cyclic redundancy check codes, the large number of circuit components are required for the prior art code generating circuit, and the circuit configuration is complicated.

SUMMARY OF THE INVENTION

It is therefore an important object of the present invention to provide a code generator which selectively produces cyclic redundancy check codes different in data length.

To accomplish the object, the present invention proposes to change a data path depending upon a cyclic redundancy check code.

In accordance with one aspect of the present invention, there is provided a code generator supplied with a digital signal for selectively producing cyclic redundancy check codes respectively representative of cyclic redundancy check values through polynomials different from one another in degree, the code generator comprising a plurality of flip flop circuits equal in number to the maximum degree of the polynomials, and connected in cascade, exclusive-OR gate means selectively inserted into the cascade connection of the plurality of flip flop circuits and multiplexing means selectively inserted into the cascade connection, and the plurality of flip flop circuits, the exclusive-OR gate means and the multiplexing means forming a plurality of data paths selectively used for calculating the cyclic redundancy check values.

BRIEF DESCRIPTION OF THE DRAWINGS

The features and advantages of the code generator will be more clearly understood from the following description taken in conjunction with the accompanying drawings in which.

DESCRIPTION OF THE PREFERRED EMBODIMENTS

First Embodiment

Figure 6:
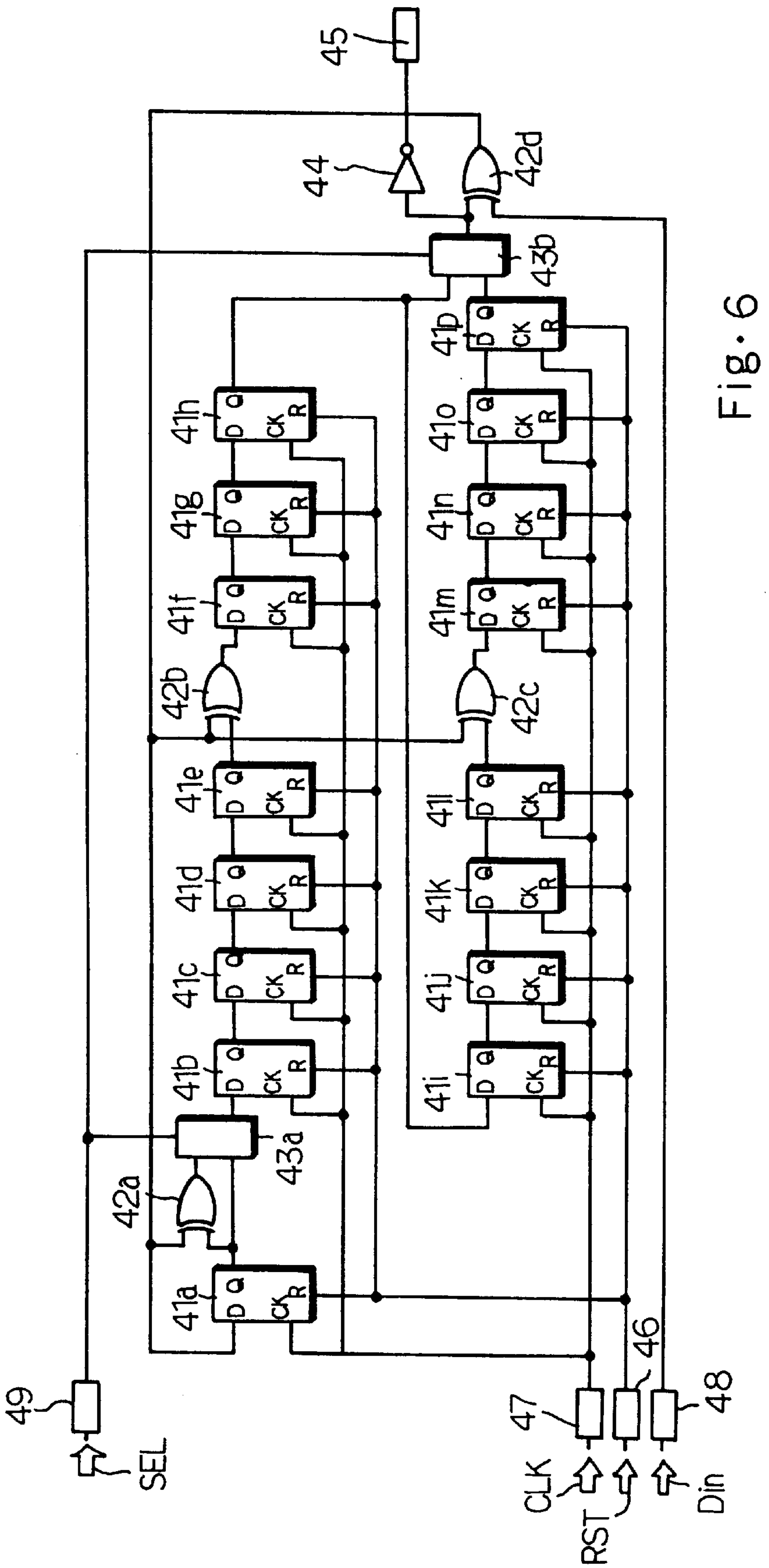
FIG. 6 is a circuit diagram showing the circuit configuration of a code generator according to the present invention.

Referring to FIG. 6 of the drawings, a code generator embodying the present invention selectively produces an 8-bit cyclic redundancy check code CRC8 and a 16-bit cyclic redundancy check code CRC16. The 8-bit cyclic redundancy check code CRC8 and the 16-bit cyclic redundancy check code represent cyclic redundancy check data values $G_8(X)$ and $G_{16}(X)$, and the cyclic redundancy check data values $G_8(X)$ and $G_{16}(X)$ are expressed by equations 1 and 2, respectively. Variable X in equation 1 has the maximum degree of 8, and variable X in equation 2 has the maximum degree of 16.

The code generator comprises sixteen flip flop circuits 41*a*, 41*b*, 41*c*, 41*d*, 41*e*, 41*f*, 41*g*, 41*h*, 41*i*, 41*j*, 41*k*, 41*l*, 41*m*, 41*n*, 41*o* and 41*p* equal to the maximum degree of variable X for the cyclic redundancy check code CRC16, four exclusive-OR gates 42*a*, 42*b*, 42*c* and 42*d*, two multiplexers 43*a* and 43*b* and an inverter 44. The flip flop circuits 41*a* to 41*p*, the exclusive-OR gates 42*a* to 42*d* and the multiplexers 43*a* and 43*b* are arranged in such a manner as to form a data path, and the eighth flip flop circuit 41*h* is further connected to the multiplexer 43*b*. The multiplexer 43*b* is connected through the inverter 44 to a data output terminal 45. A reset terminal 46 is connected to the reset nodes R of the flip flop circuits 41*a* to 41*p*, and a reset signal RST changes the output bits at the output nodes Q of all the flip flop circuits 41*a* to 41*p* to logic "1" level. The reset signal RST is supplied to the reset terminal 46 before the calculation for a cyclic redundancy check code CRC8/CRC16. A clock terminal 47 is connected to the clock nodes CK of the flip flop circuits 41*a* to 41*p*, and a serial data signal Din representative of a transmission data code or a header is supplied through the data input node 48 to the exclusive-OR gate 42*d*. A control signal SEL is supplied through a control terminal 49 to the multiplexers 43*a* and 43*b*, and changes the data path of the code generator as will be described hereinlater. The component bits of the serial data signal Din are rippled from the flip flop circuit to the next flip flop circuit in synchronism with a clock signal CLK, and the exclusive-OR gates 42*a*/42*b*/4*c* carry out the exclusive-OR operation between the output bit of the flip flop circuits 41*a*, 41*e* and 41*h*/41*p* and the output bit of the exclusive-OR gate 42*d* and a component bit of the serial data signal Din.

The number of the flip flop circuits 41*a* to 41*p* is equal to the maximum degree of variable X for the cyclic redundancy check code CRC16. In this instance, the 16-bit cyclic redundancy check code CRC16 is longer in data length than the 8-bit cyclic redundancy check code CRC8 and thus determines the maximum degree of X. The cyclic redundancy check data value $G_{16}(X)$ is expressed by equation 2, and the maximum degree of variable X is 16.

The number of the exclusive-OR gates 42*a* to 42*d* is equal to the number of terms $X^n$ incorporated in the equations for the cyclic redundancy data codes CRC8/CRC16 where n is natural number, i.e., 1, 2, . . . However, the term $X^{n\text{-}max}$ with the maximum degree in the equation for the cyclic redundancy data code shorter in data length is excluded and any term $X^{n\text{-}com}$ common between the equations is counted only once. In this instance, total number of terms $X^n$ is six, i.e., $X^8, X^5, X^1, X^{16}, X^{12}$ and $X^5$. The cyclic redundancy check code CRC8 is shorter in data length than the cyclic redundancy check code CRC16, and term $X^{n\text{-}max}$ is $X^8$. Term $X^5$ is shared between the equations, and is counted once. Terms $X^8$ and $X^5$ are deleted from the terms $X^n$. Then, the total number of terms $X^n$ is decreased to four, and four exclusive-OR gates 42*a* to 42*d* are incorporated in the code generator. In this instance, degrees "n" are 1, 5, 12 and 16, and the exclusive-OR gates 42*a* to 42*d* are respectively inserted between the first flip flop circuit 41*a* and the second flip flop circuit 41*b*, between the fifth flip flop circuit 41*e* and the sixth flip flop circuit 41*f*, between the twelfth flip flop circuit 41*l* and the thirteenth flip flop circuit 41*m* and between the sixteenth flip flop circuit 41*p* and the first flip flop circuit 41*a*.

The number N2 of multiplexers 43*a* and 43*b* is equal to the number of terms $X^m$ incorporated in the equation for the cyclic redundancy check code shorter in data length where m is natural number 1, 2, . . . . However, if any term $X^{m\text{-}com}$ is shared with the other equation, term $X^{m\text{-}com}$ is deleted from that terms $X^m$. In this instance, equation 1 is used for the cyclic redundancy check code CRC8 which is shorter than the code CRC16, and term $X^5$ is deleted from terms $X^m$. The total number of terms $X^m$ is two in this instance, and degrees "m" are 1 and 8. For this reason, the multiplexers 43a and 43b are associated with the first flip flop circuit 41a and the eighth flip flop circuit 41h, respectively, and are connected between the exclusive-OR gate 42a and the second flip flop circuit 41b and between the eighth flip flop circuit 41h and the exclusive-OR gate 42d.

Figure 2:
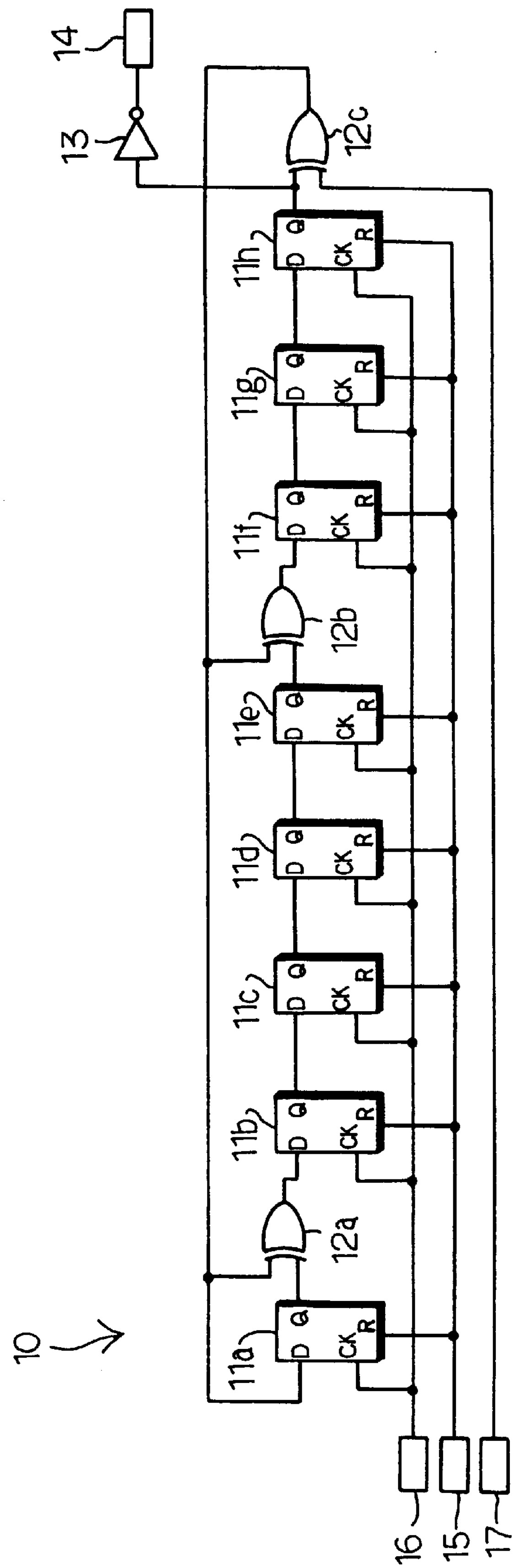
FIG. 2 is a circuit diagram showing the circuit configuration of the prior art code generator for producing the 8-bit cyclic redundancy check code.
Figure 3:
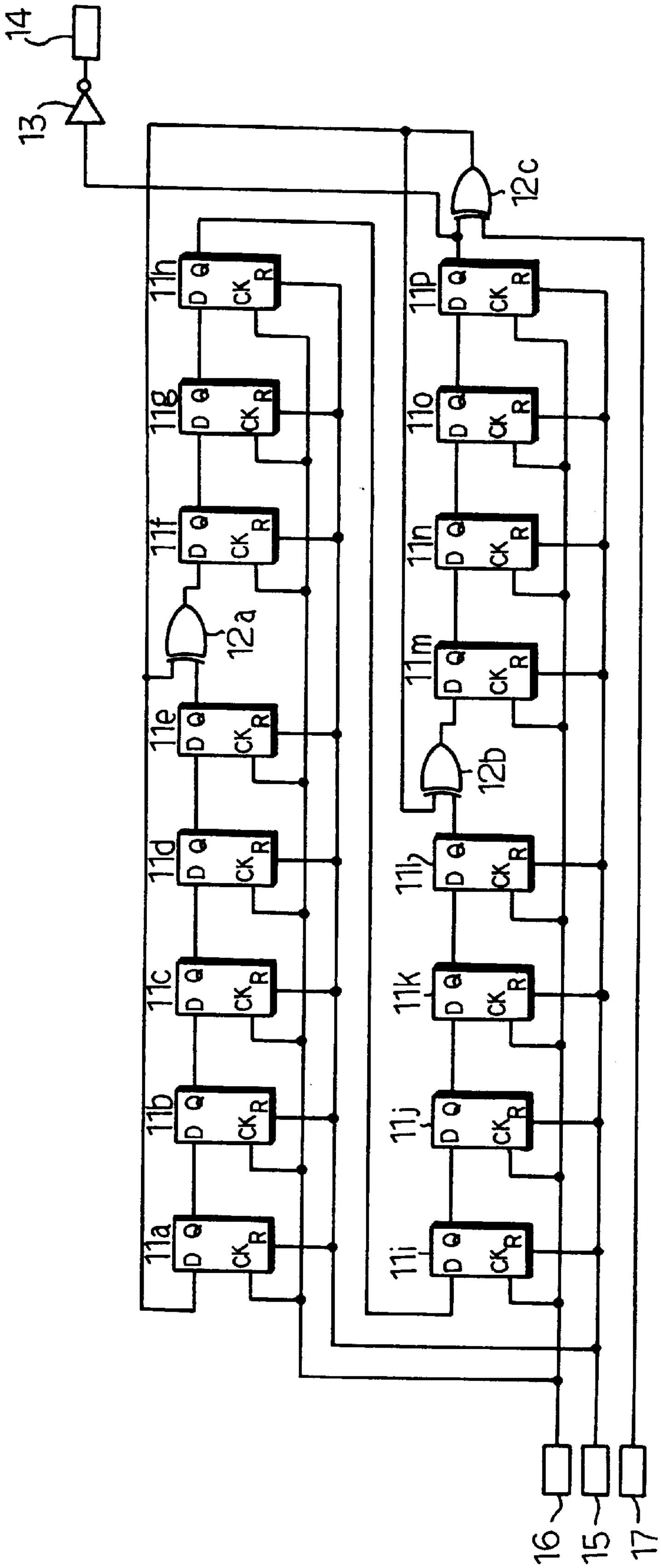
FIG. 3 is a circuit diagram showing the circuit configuration of the prior art code generator for producing the 16-bit cyclic redundancy check data code.
Figure 4A:
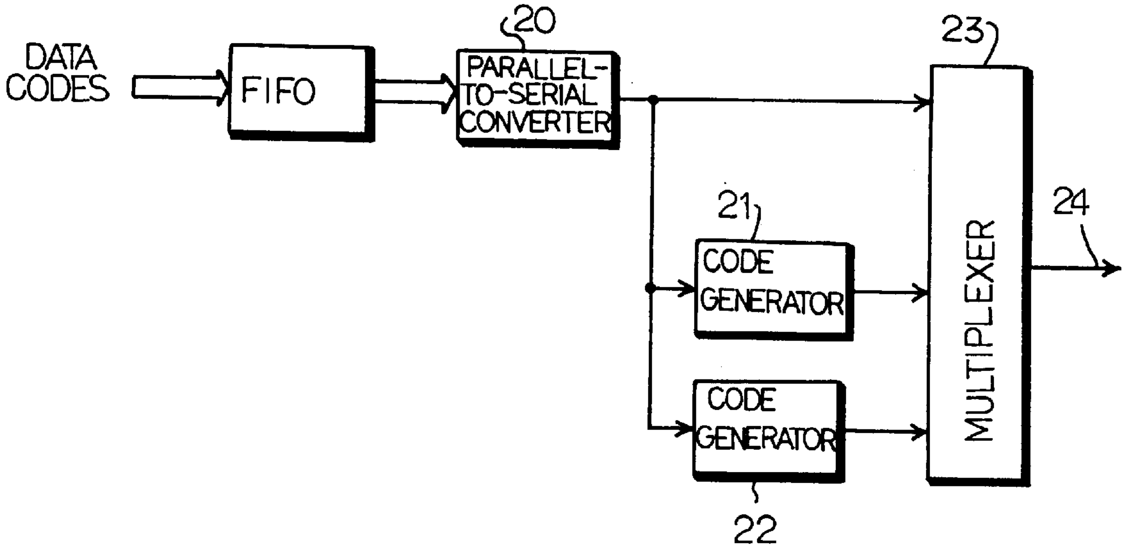
FIGS. 4A and 4B are block diagrams showing the circuit configurations of the prior art transmitters for transmitting transmission data frames different from one another.
Figure 4B:
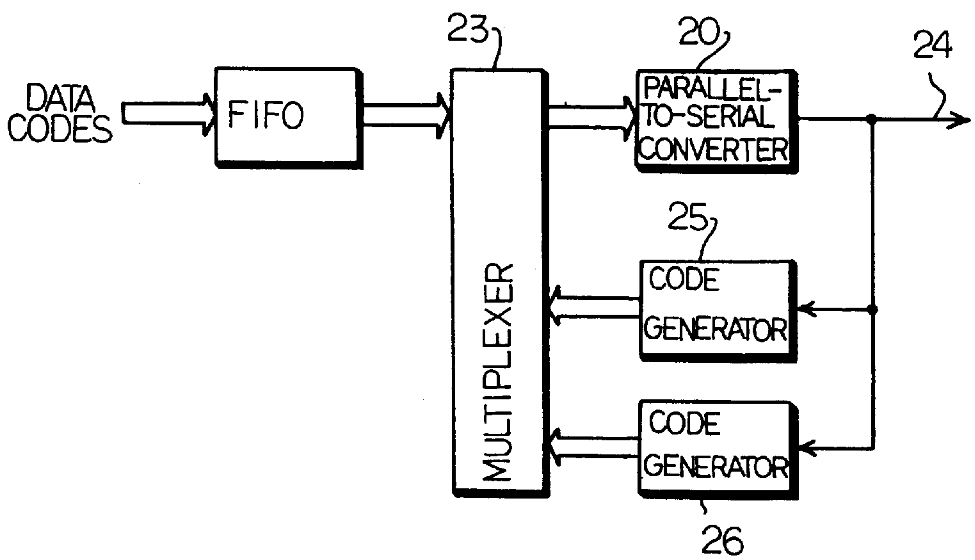
Figure 5:
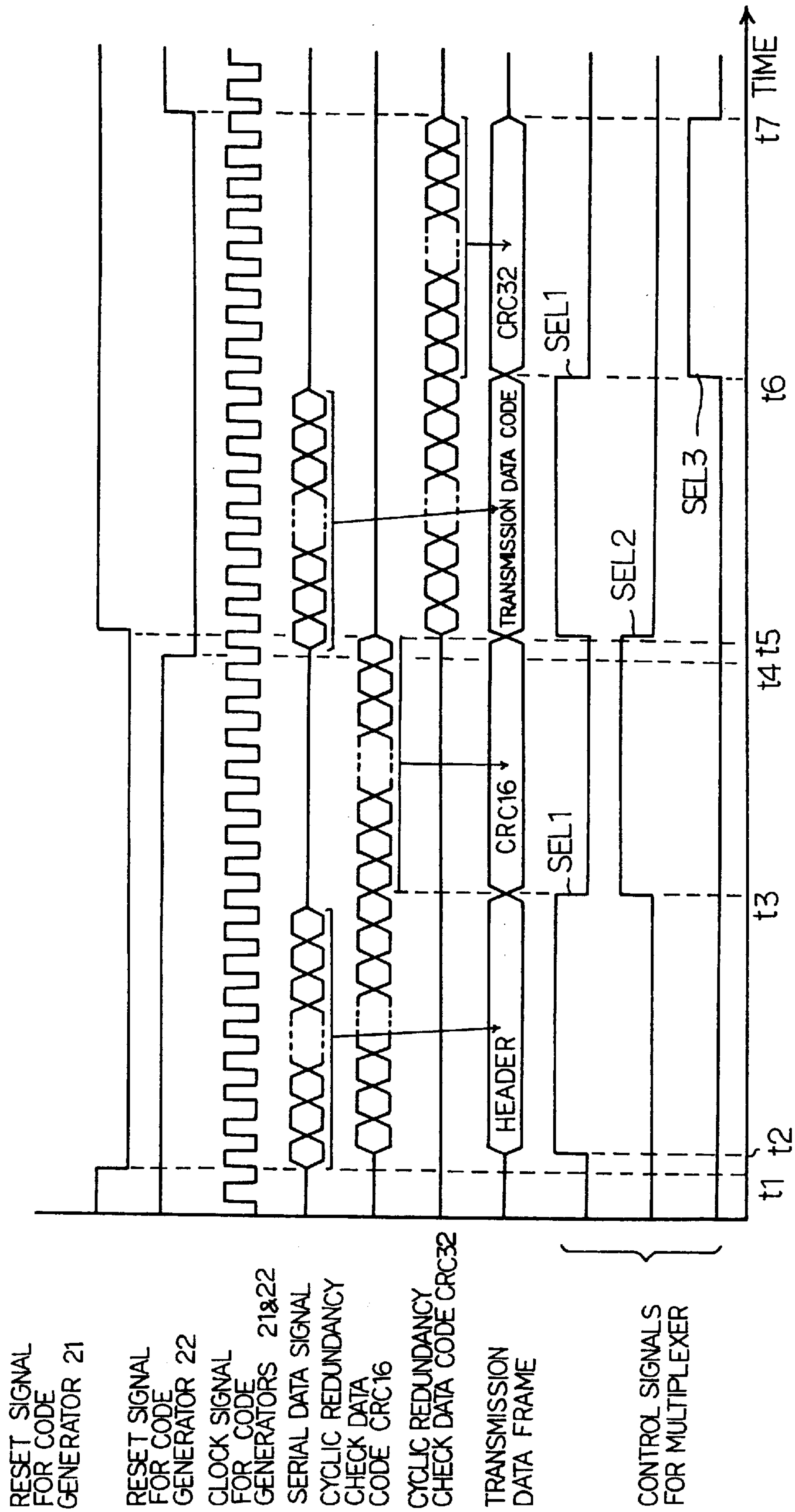
FIG. 5 is a timing chart showing the data transmission through the prior art transmitter shown in FIG. 4A.

The multiplexer 43a selectively connects the output node Q of the first flip flop circuit 41a and the exclusive-OR gate 42a to the second flip flop circuit 41b, and the multiplexer 43b selectively connects the eighth flip flop circuit 41h and the sixteenth flip flop circuit 41p to the inverter 44. When the multiplexers 43a and 43b connect the exclusive-OR gate 42a and the eighth flip flop circuit 41h to the second flip flop circuit 41b and the inverter 44/exclusive-OR gate 42d, respectively, the code generator shown in FIG. 6 is equivalent to the code generator shown in FIG. 2, and produces the 8-bit cyclic redundancy check code CRC8. On the other hand, when the multiplexers 43a and 43b connect the first flip flop circuit 41a and the sixteenth flip flop circuit 41p to the second flip flop circuit 41b and the inverter 44/exclusive-OR gate 42d, the code generator shown in FIG. 6 is equivalent to the code generator shown in FIG. 3, and produces the 16-bit cyclic redundancy check code CRC16.

The equation for the cyclic redundancy check data value $G_8(X)$ has the term $X^1$. However, the equation for the cyclic redundancy check data value $G_{16}(X)$ does not have the term $X^1$. For this reason, the multiplexer 43a connects the exclusive-OR gate 42a to the second flip flop circuit 41b. Both equations have term $X^5$, and the exclusive-OR gate 42b is connected between the fifth flip flop circuit 11e and the sixth flip flop circuit 11f without a multiplexer. Although term $X^{12}$ is only incorporated in the equation for the 16-bit cyclic redundancy check code CRC16, the exclusive-OR gate 42c is connected between the twelfth flip flop circuit 41l and the thirteenth flip flop circuit 41m without a multiplexer, because the 8-bit cyclic redundancy check code CRC8 is delivered from the eighth flip flop circuit 41h.

Figure 7A:
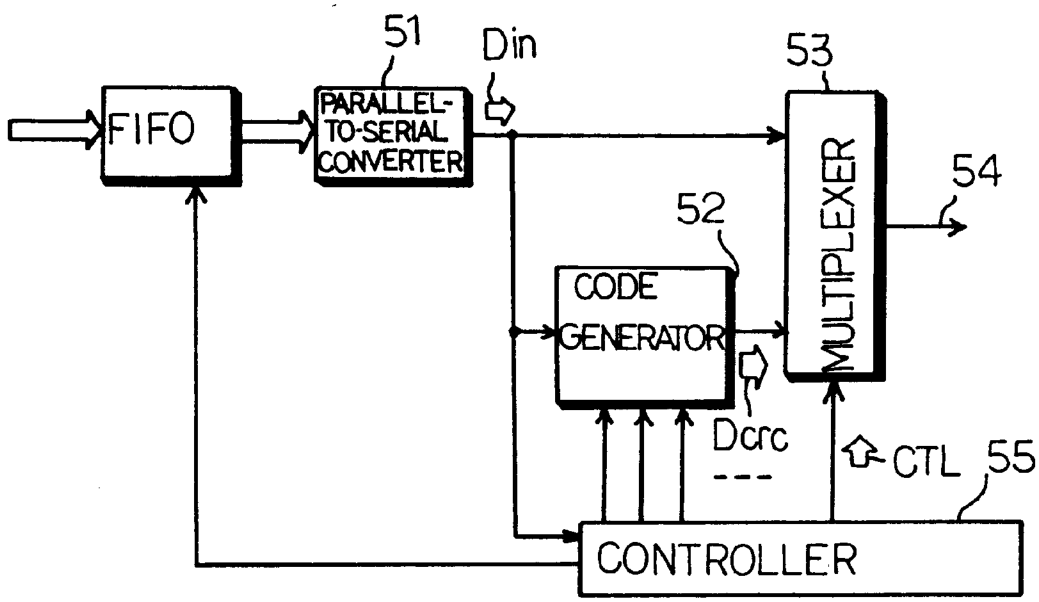
FIGS. 7A and 7B are block diagrams showing the circuit configurations of transmitters for transmitting different transmission data frames.
Figure 7B:
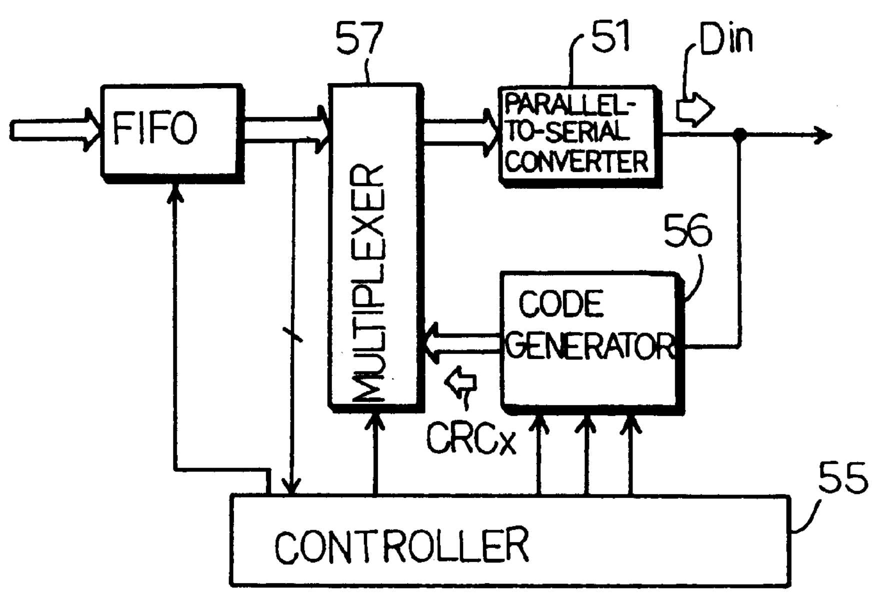

The code generator shown in FIG. 6 forms a part of a transmitter, and FIGS. 7A and 7B illustrate two different circuit configurations. The transmitter shown in FIG. 7A includes a first-in-first-out register FIFO connected to a data source (not shown), a parallel-to-serial converter 51 connected to the first-in-first-out register FIFO; a code generator 52 connected to the parallel-to-serial converter 52; a multiplexer 53 connected between the parallel-to-serial converter 51; the code generator 52 and an output terminal 54; and a controller 55 for controlling the code generator 52 and the multiplexer 53. The code generator 52 is similar in circuit configuration to the code generator shown in FIG. 6.

The transmission data codes different in data length or the header code/transmission data code are supplied to the first-in-first-out register 51, and enter into a waiting queue. The transmission data codes or the header code/transmission code are sequentially read out from the first-in-first-out register FIFO, and the parallel-to-serial converter 51 produces the serial data signal Din from the read-out code.

The serial data signal Din is supplied to the code generator 52 and the multiplexer 53. The controller 55 supplies a control signal CTL of logic "1" level to the multiplexer 53, and causes the multiplexer 53 to transmit the serial data signal Din representative of the header or the transmission data code to the output terminal 54. The header code or the transmission data code is delivered to a receiver (not shown) as the transmission data field 1a/1b or the header field 3a.

The controller 55 resets the code generator 52, and changes the data path depending upon the read-out code with the control signal SEL. The code generator 52 accepts the serial data signal Din, and calculates the cyclic redundancy check value Gx(X) on the basis of the header code/transmission data code represented by the serial data signal Din. The controller 55 changes the control signal CTL to logic "0" level, and the multiplexer 53 transfers a serial data signal Dcrc representative of the cyclic redundancy check code CRCx to the output terminal 54. The serial data signal Dcrc is delivered to the receiver as the cyclic redundancy data field 1b/2b/3c/3d.

The transmitter shown in FIG. 7B includes the first-in-first-out register FIFO; a code generator 56 for producing a cyclic redundancy check code CRCx from the serial data signal Din; the parallel-to-serial converter 51; a multiplexer 57 connected between the first-in-first-out register/code generator FIFO/56 and the parallel-to-serial converter 51 and the controller 55. The code generator 56 supplies the cyclic redundancy check code CRCx to the multiplexer 57 as parallel data.

The transmission data codes 1a/2a or the header code/the transmission data code 3a/3b are accumulated in the first-in-first-out register FIFO, and, thereafter, are read out therefrom. The controller 55 causes the multiplexer 57 to connect the first-in-first-out register FIFO to the parallel-to-serial converter 51, and each read-out code is converted to the serial data signal Din. The serial data signal Din representative of the header code or the transmission data code is delivered to a receiver (not shown) as the header field 3a or the transmission data field 1a/2a/3b.

The controller 55 resets the code generator 56, and changes the data path to calculate the cyclic redundancy check value Gx(X) on the basis of the read-out code. The serial data signal Din is accumulated in the code generator 56 in synchronism with the clock signal CLK, and carries out the calculation for the cyclic redundancy check value Gx(X).

The controller 55 causes the multiplexer 57 to connect the code generator 56 to the parallel-to-serial converter 51, and the code generator 56 supplies the cyclic redundancy check code CRCx through the multiplexer 57 to the parallel-to-serial converter 51. The parallel-to-serial converter 51 converts the cyclic redundancy check code CRCx to the serial data signal Din, and the serial data signal Din representative of the cyclic redundancy check code CRCx is delivered to the receiver as the cyclic redundancy check field 1b/2b/3c/3d.

Figure 1A:
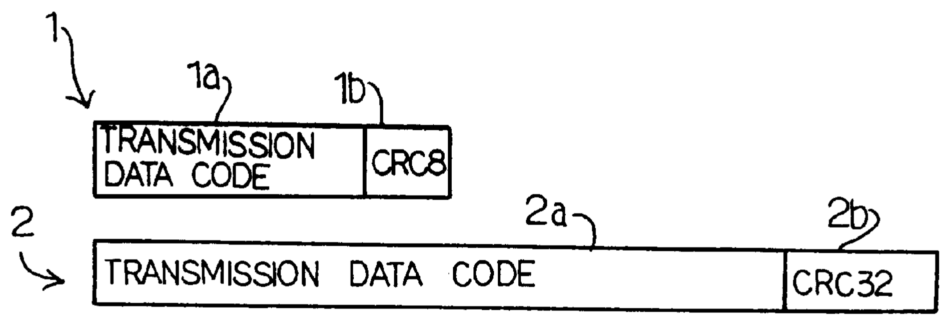
FIGS. 1A and 1B are views showing the format for the transmission data frame.
Figure 1B:
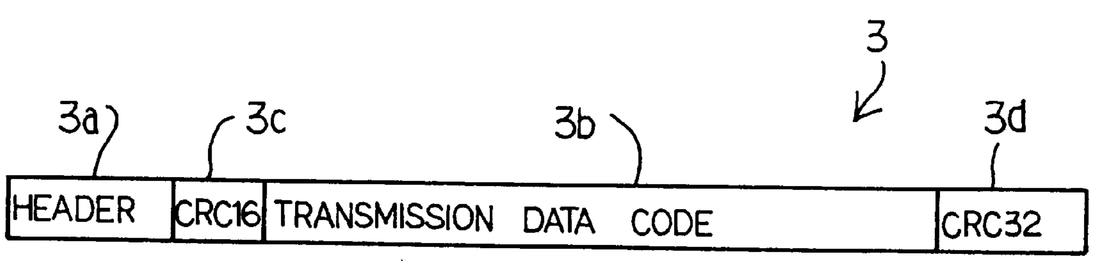
Figure 8:
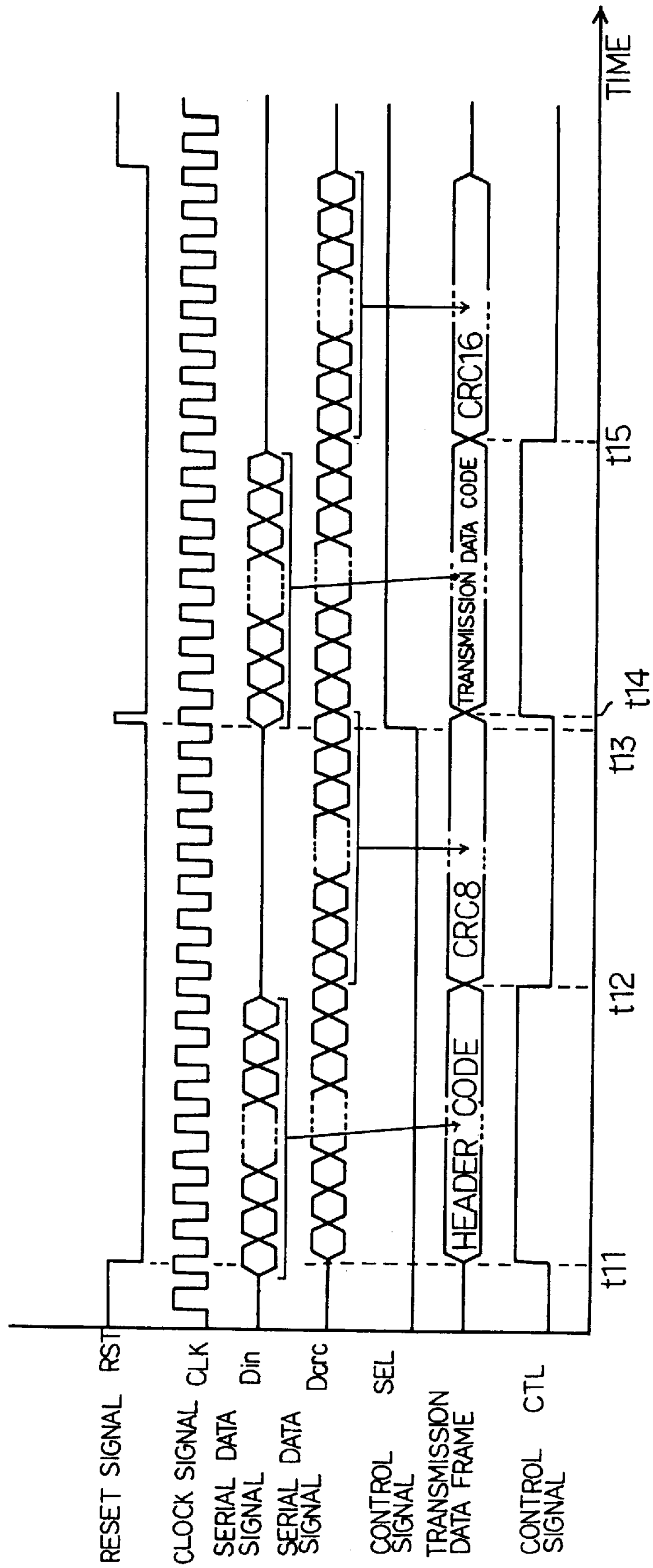
FIG. 8 is a timing chart showing a data transmission carried out by the transmitter.

FIG. 8 illustrates the data transmission. The transmission data is assumed to be formatted as shown in FIG. 1B. However, the header code and the transmission data code are shorter than those of the prior art, and 8-bit cyclic redundancy data code CRC8 and 16-bit cyclic redundancy check code CRC16 are required for the header code and the transmission data code, respectively. The transmitter has the circuit configuration shown in FIG. 7A.

The controller 55 changes the reset signal RST to logic "0" level at time t11, and code generator 52 is changed to be ready for calculation. The controller 55 further changes the control signal CTL to logic "1" level, and the multiplexer 53 provides a data path between the parallel-to-serial converter 51 and the output terminal 54. The controller 55 maintains the control signal SEL in logic "0" level, and the multiplexers 43a/43b select the exclusive-OR gate 42a and the eighth flip flop circuit 41h.

The header code is read out from the first-in-first-out register FIFO, and the parallel-to-serial converter 51 converts the header code to the serial data signal Din. The serial data signal Din is supplied to the multiplexer 53 and the code generator 52. The multiplexer 53 transfers the serial data signal Din to the output terminal 54, and the serial data signal Din representative of the header code is delivered to the receiver as the header field 3*a*.

On the other hand, the code generator 52 accumulates the serial data signal Din in synchronism with the clock signal CLK, and calculates the cyclic redundancy check value $G_8(X)$.

The controller 55 changes the control signal CTL to logic "0" level at time t12, and the multiplexer 53 connects the code generator 52 to the output terminal 54. Then, the serial data signal Dcrc representative of the cyclic redundancy check code CRCS is supplied to the output terminal 54, and is delivered to the receiver as the cyclic redundancy check data field 3*c*.

Subsequently, the controller 55 changes the control signal SEL to logic "1" level at time t13, and the multiplexers 43*a*/43*b* select the first flip flop circuit 41*a* and the sixteenth flip flop circuit 41*p*. The code generator 52 is modified to calculate the cyclic redundancy check value $G_{16}(X)$. The controller 55 further changes the reset signal RST to logic "1" level, and the output nodes Q of all the flip flop circuits 41*a* to 41*p* are changed to logic "1" level. The controller 55 further changes the control signal CTL to logic "1" level, and the multiplexer 53 connects the parallel-to-serial converter 51 to the output terminal 54, again.

The transmission data code is read out from the first-in-first-out register FIFO, and the parallel-to-serial converter 51 converts the transmission data code to the serial data signal Din. The serial data signal Din representative of the transmission data code is transferred through the multiplexer 53) to the output terminal 54, and is delivered to the receiver as the transmission data field 3*b*.

The serial data signal Din is accumulated into the code generator 52 in synchronism with the clock signal CLK, and the code generator 52 calculates the cyclic redundancy check value $G_{16}(X)$.

The controller 55 changes the control signal CTL to logic "0" level at time t15, and the multiplexer 53 connects the code generator 52 to the output terminal 54, again. Then, the serial data signal Dcrc representative of the cyclic redundancy check code CRC16 is transferred through the multiplexer 53 to the output terminal 54, and is delivered to the receiver as the cyclic redundancy check data field 3*d*.

As will be appreciated from the foregoing description, the code generator according to the present invention changes the cyclic redundancy code length depending upon the data length, and the circuit components for a short cyclic redundancy check code is shared between the short data path and the long data path. This results in that a relatively small number of circuit components form a code generator producing cyclic redundancy check codes different in data length. The prior art transmitter requires twenty-four flip flops six exclusive-OR gates for the cyclic redundancy check codes CRC8 and CRC16. However, only 16 flip flop circuits and four exclusive-OR gates form the code generator shown in FIG. 6.

Second Embodiment

Figure 9:
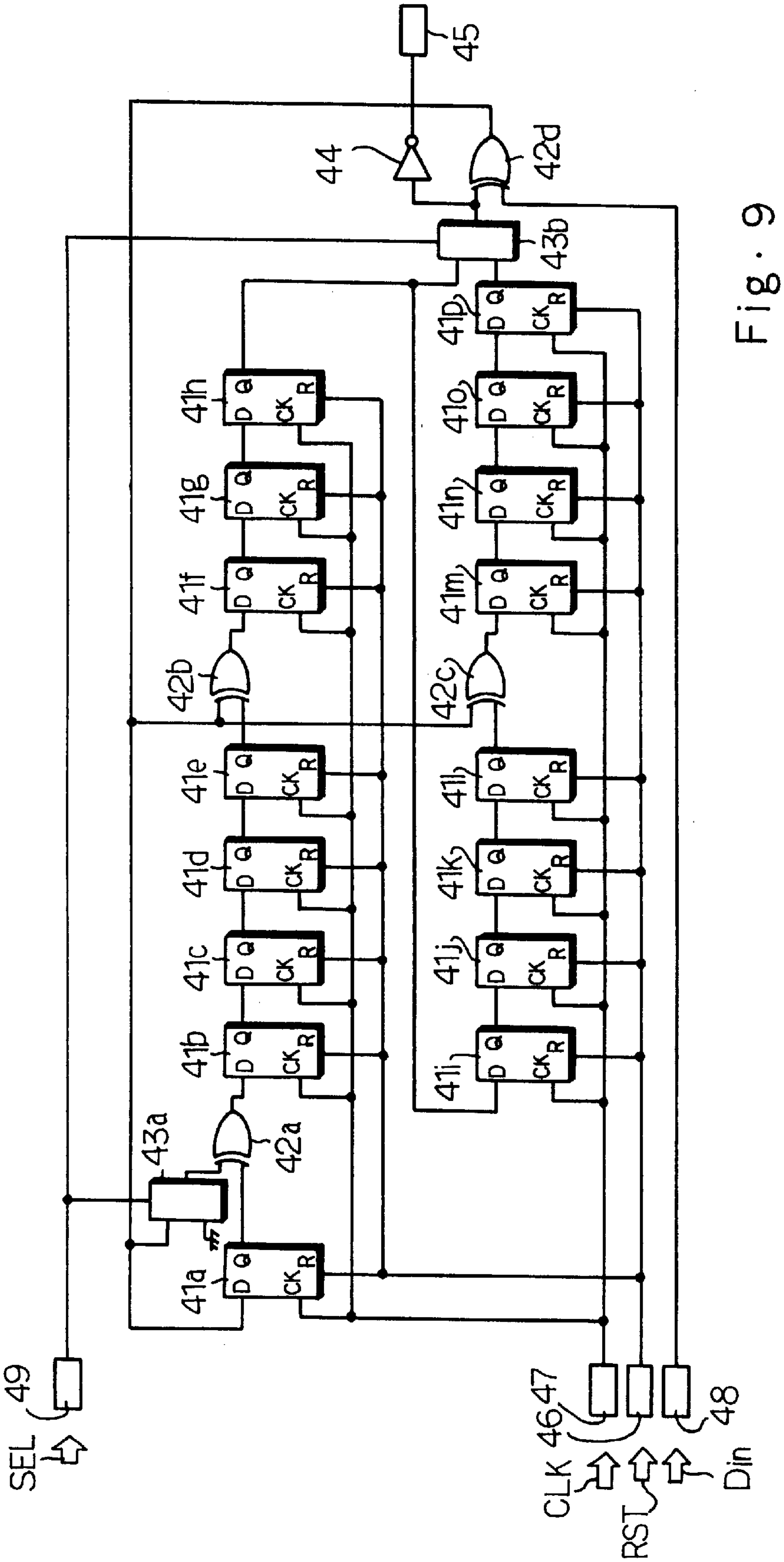
FIG. 9 is a circuit diagram showing the circuit configuration of another code generator according to the present invention.

Turning to FIG. 9 of the drawings, another code generator embodying the present invention selectively produces a cyclic redundant check code CRC8 and a cyclic redundant check code CRC16. The sixteen flip flop circuits 41*a* to 41*p*, the four exclusive-OR gates 42*a* to 42*d*, the two multiplexers 43*a* and 43*b* and the inverter 44 also form in combination the code generator implementing the second embodiment. The first difference between the first embodiment and the second embodiment is that the output node of the exclusive-OR gate 42*a* is directly connected to the second flip flop circuit 41*b*, and the second difference is that the multiplexer 43*a* is connected between the output node of the exclusive-OR gate 4*d* source of logic "0" level and the input node of the exclusive-OR gate 42*a*.

The multiplexer 43*b* selects the eighth flip flop circuit 41*h* in the presence of the control signal SEL of logic "0" level and the sixteenth flip flop circuit 41*p* in the presence of the control signal SEL of logic "1" level.

When the control signal SEL is changed to logic "0" level, the multiplexer 43*a* connects the output node of the exclusive-OR gate 42*d* to the input node of the exclusive-OR gate 42*a*. As a result, the code generator shown in FIG. 9 becomes equivalent to the prior art code generator shown in FIG. 2. On the other hand, the control signal SEL of logic "1" level causes the multiplexer 43*a* to connect the source of logic "0" level to the input node of the exclusive-OR gate 42*a*. In this situation, if the first flip flop circuit 41*a* outputs logic "0" level, the exclusive-OR gate 42*a* yields logic "0" level. On the other hand, if the output bit of the first flip flop circuit 41*a* is changed to logic "1" level, the exclusive-OR gate 42*a* yields logic "1" level. Thus, the output bit of the exclusive-OR gate 42*a* is identical in logic level with the output bit of the first flip flop circuit 41*a*, and the code generator shown in FIG. 9 becomes equivalent to the prior art code generator shown in FIG. 3.

The code generator shown in FIG. 9 achieves all the advantages of the code generator implementing the first embodiment, and is also available for the transmitter shown in FIG. 7A.

Although particular embodiments of the present invention have been shown and described, it will be obvious to those skilled in the art that various changes and modifications may be made without departing from the spirit and scope of the present invention.

For example, a code generator may produce any combination of cyclic redundancy check codes CRCx and CRCy such as, for example, CRC16 and CRC32.

What is claimed is:

1. A code generator supplied with a digital signal for selectively producing cyclic redundancy check codes respectively representative of cyclic redundancy check values through polynomials different from one another in degree, comprising:

a plurality of flip flop circuits equal in number to the maximum degree of said polynomials, and connected in cascade;

exclusive-OR gate means selectively inserted into the cascade connection of said plurality of flip flop circuits; and multiplexing means selectively inserted into said cascade connection of said plurality of flip flop circuits, said exclusive-OR gate means and said multiplexing means forming a plurality of data paths selectively used for calculating said cyclic redundancy check values wherein each of said flip flop circuits consists only of a single flip flop.

2. The code generator as set forth in claim 1, in which a plurality of exclusive-OR gates serve as said exclusive-OR gate means, and are equal in number to the number of variable terms of differing degree in said polynomials excluding a highest degree term in a polynomial of degree smaller than said maximum degree.

3. The code generator as set forth in claim 2, in which said plurality of exclusive-OR gates are associated with flip flop circuits in said cascade at stages corresponding to the degrees of said variable terms of differing degrees, excluding said highest degree term of said smaller degree polynomial.

4. The code generator as set forth in claim 1, in which said multiplexing means comprises a multiplexer, said multiplexer having input nodes connected to flip flop circuits serving as final stages of said plurality of data paths, said cyclic redundancy check codes being supplied from said multiplexer.

5. The code generator as set forth in claim 1, in which said multiplexing means is implemented by a plurality of multiplexers equal in number to the number of variable terms in a polynomial of degree smaller than said maximum degree, excluding any terms of degree common among said polynomials.

6. The code generator as set forth in claim 5, in which each of said multiplexers are associated with flip flop circuits at stages corresponding to the degrees of said variable terms in said small degree polynomial, not counting said common degree terms.

7. The code generator as set forth in claim 1, in which a plurality of exclusive-OR gates serve as said exclusive-OR means, and are equal in number to the number of variable terms of differing degree in said polynomials, excluding a highest degree term in a polynomial of degree smaller than said maximum degree, and said multiplexing means is implemented by a plurality of multiplexers equal in number to the number of variable terms in said small degree polynomial, excluding any terms that may exist of degree common among said polynomials.

8. The code generator as set forth in claim 7, in which each of said plurality of exclusive-OR gates are associated with flip flop circuits in said cascade at stages corresponding to the degree of said variable terms of differing degrees excluding said highest degree term of said smaller degree polynomial, and said multiplexers are associated with flip flop circuits in said cascade at stages corresponding to the degrees of said variable terms in said smaller degree polynomial, excluding said common degree terms that may exist.

9. The code generator as set forth in claim 8, in which one of said plurality of exclusive-OR gates has input nodes respectively connected to an input terminal supplied with said digital signal and an output node of one of said plurality of multiplexers, and said one of said plurality of multiplexers has input nodes respectively connected to flip flop circuits serving as final stages of said plurality of data paths, and has an output node selectively supplying said cyclic redundancy check codes to an output terminal, each of the others of said exclusive-OR gates has an input node connected to an output of the flip flop circuit of an associated stage, and has an output node connected to a multiplexer of the associated stage, each of the multiplexers other than said one of said plurality of multiplexers has input nodes respectively connected to an output node of the flip flop circuit of the associated stage and to the output node of the exclusive-OR gate of the associated stage, and has an output node connected to an input node of the flip flop circuit associated with the next stage.

10. The code generator as set forth in claim 8, in which one of said plurality of exclusive-OR gates has input nodes respectively connected to an input terminal supplied with said digital signal and an output node of one of said plurality of multiplexers, and said one of said plurality of multiplexers has input nodes respectively connected to flip flop circuits serving as final stages of said plurality of data paths, and has an output node selectively supplying said cyclic redundancy check codes to an output terminal, each of the others of said exclusive-OR gates has an input node connected to an output of the flip flop circuit of an associated stage and an output node connected to an input node of the flip flop circuit of the next stage, each of the others of said multiplexers having input nodes, respectively connected to an output node of said one of said plurality of exclusive-OR gates and a second input node connected to a source of predetermined logic level, and has an output node connected to an input node of the exclusive-OR sate of the associated stage.

11. A code generator supplied with a digital signal for selectively producing cyclic redundancy check codes respectively representative of cyclic redundancy check values through polynomials different from one another in degree, comprising:

a plurality of flip flop circuits equal in number to the maximum degree of said polynomials, and connected in cascade;

exclusive-OR gate means selectively inserted into the cascade connection of said plurality of flip flop circuits; and multiplexing means selectively inserted into said cascade connection of said plurality of flip flop circuits, said exclusive-OR gate means and said multiplexing means forming a plurality of data paths selectively used for calculating said cyclic redundancy check values wherein each of said flip flop circuits consists only of a single flip flop, in which said multiplexing means comprises a multiplexer, said multiplexer having input nodes connected to flip flop circuits serving as final stages of said plurality of data paths, said cyclic redundancy check codes being supplied from said multiplexer.

12. A code generator supplied with a digital signal for selectively producing cyclic redundancy check codes respectively representative of cyclic redundancy check values through polynomials different from one another in degree, comprising:

a plurality of flip flop circuits equal in number to the maximum degree of said polynomials, and connected in cascade;

exclusive-OR gate means selectively inserted into the cascade connection of said plurality of flip flop circuits; and multiplexing means selectively inserted into said cascade connection of said plurality of flip flop circuits, said exclusive-OR gate means and said multiplexing means forming a plurality of data paths selectively used for calculating said cyclic redundancy check values wherein each of said flip flop circuits consists only of a single flip flop, in which a plurality of exclusive-OR gates serve as said exclusive-OR means, and are equal in number to the number of variable terms of differing degree in said polynomials, excluding a highest degree term in a polynomial of degree smaller than said maximum degree, and said multiplexing means is implemented by a plurality of multiplexers equal in number to the number of variable terms in said small degree polynomial, excluding any terms that may exist of degree common among said polynomials, in which each of said plurality of exclusive-OR gates are associated with flip flop circuits in said cascade at stages corresponding to the degree of said variable terms of differing degrees excluding said highest degree term of said smaller degree polynomial, and said multiplexers are associated with flip flop circuits in said cascade at stages corresponding to the degrees of said variable terms in said smaller degree polynomial, excluding said common degree terms that may exist, and in which one of said plurality of exclusive-OR gates has input nodes respectively connected to an input terminal supplied with said digital signal and an output node of one of said plurality of multiplexers, and said one of said plurality of multiplexers has input nodes respectively connected to flip flop circuits serving as final stages of said plurality of data paths, and has an output node selectively supplying said cyclic redundancy check codes to an output terminal, each of the others of said exclusive-OR gates has an input node connected to an output of the flip flop circuit of an associated stage, and has an output node connected to a multiplexer of the associated stage, each of the multiplexers other than said one of said plurality of multiplexers has input nodes respectively connected to an output node of the flip flop circuit of the associated stage and to the output node of the exclusive-OR gate of the associated stage, and has an output node connected to an input node of the flip flop circuit associated with the next stage.

13. A code generator supplied with a digital signal for selectively producing cyclic redundancy check codes respectively representative of cyclic redundancy check values through polynomials different from one another in degree, comprising:

a plurality of flip flop circuits equal in number to the maximum degree of said polynomials, and connected in cascade;

exclusive-OR gate means selectively inserted into the cascade connection of said plurality of flip flop circuits; and multiplexing means selectively inserted into said cascade connection of said plurality of flip flop circuits, said exclusive-OR gate means and said multiplexing means forming a plurality of data paths selectively used for calculating said cyclic redundancy check values, in which a plurality of exclusive-OR gates serve as said exclusive-OR means, and are equal in number to the number of variable terms of differing degree in said polynomials, excluding a highest degree term in a polynomial of degree smaller than said maximum degree, and said multiplexing means is implemented by a plurality of multiplexers equal in number to the number of variable terms in said small degree polynomial, excluding any terms that may exist of degree common among said polynomials, in which each of said plurality of exclusive-OR gates are associated with flip flop circuits in said cascade at stages corresponding to the degree of said variable terms of differing degrees excluding said highest degree term of said smaller degree polynomial, and said multiplexers are associated with flip flop circuits in said cascade at stages corresponding to the degrees of said variable terms in said smaller degree polynomial, excluding said common degree terms that may exist, and in which one of said plurality of exclusive-OR gates has input nodes respectively connected to an input terminal supplied with said digital signal and an output node of one of said plurality of multiplexers, and said one of said plurality of multiplexers has input nodes respectively connected to flip flop circuits serving as final stages of said plurality of data paths, and has an output node selectively supplying said cyclic redundancy check codes to an output terminal, each of the others of said exclusive-OR gates has an input node connected to an output of the flip flop circuit of an associated stage and an output node connected to an input node of the flip flop circuit of the next stage, each of the others of said multiplexers having input nodes, respectively connected to an output node of said one of said plurality of exclusive-OR gates and a second input node connected to a source of predetermined logic level, and has an output node connected to an input node of the exclusive-OR gate of the associated stage.

* * * * *